United States Patent
Jo

(10) Patent No.: US 10,439,167 B2
(45) Date of Patent: Oct. 8, 2019

(54) ORGANIC LIGHT EMITTING DISPLAY DEVICE AND HEAD-MOUNTED DISPLAY INCLUDING THE SAME

(71) Applicant: LG Display Co., Ltd., Seoul (KR)

(72) Inventor: Jang Jo, Seoul (KR)

(73) Assignee: LG DISPLAY CO., LTD., Seoul (KR)

( * ) Notice: Subject to any disclaimer, the term of this patent is extended or adjusted under 35 U.S.C. 154(b) by 169 days.

(21) Appl. No.: 15/364,055

(22) Filed: Nov. 29, 2016

(65) Prior Publication Data

US 2017/0155093 A1 Jun. 1, 2017

(30) Foreign Application Priority Data

Nov. 30, 2015 (KR) ........................ 10-2015-0169365

(51) Int. Cl.
| | | |
|---|---|---|
| *H01L 51/52* | (2006.01) | |
| *H01L 27/32* | (2006.01) | |
| *G02B 27/01* | (2006.01) | |
| *G02B 7/02* | (2006.01) | |
| *G06F 1/16* | (2006.01) | |

(52) U.S. Cl.
CPC .......... *H01L 51/5268* (2013.01); *G02B 7/021* (2013.01); *G02B 27/017* (2013.01); *G06F 1/163* (2013.01); *G06F 1/1637* (2013.01); *H01L 27/322* (2013.01); *H01L 27/3246* (2013.01); *H01L 51/5206* (2013.01); *H01L 51/5237* (2013.01); *H01L 51/5284* (2013.01); *H01L 51/5293* (2013.01); *H01L 51/5281* (2013.01)

(58) Field of Classification Search
CPC ... H01L 51/5268; G02B 7/021; G02B 27/017; G06F 1/163
See application file for complete search history.

(56) References Cited

U.S. PATENT DOCUMENTS

| | | | | |
|---|---|---|---|---|
| 8,890,172 | B2 * | 11/2014 | Yamazaki | ........... H01L 27/3211 257/79 |
| 2005/0225238 | A1 * | 10/2005 | Yamazaki | ............. H01L 27/322 313/506 |
| 2007/0013282 | A1 * | 1/2007 | Okutani | ................ H01L 27/322 313/111 |
| 2008/0042154 | A1 * | 2/2008 | Wano | .................. H01L 51/5268 257/98 |
| 2012/0080668 | A1 | 4/2012 | Seki | |
| 2012/0256218 | A1 * | 10/2012 | Kwack | ................ H01L 51/5256 257/98 |

(Continued)

FOREIGN PATENT DOCUMENTS

| | | |
|---|---|---|
| GB | 2319424 A | 5/1998 |
| JP | 2005123089 A | 5/2005 |

(Continued)

*Primary Examiner* — Sejoon Ahn
(74) *Attorney, Agent, or Firm* — Dentons US LLP

(57) ABSTRACT

Disclosed is an organic light emitting display device and a head-mounted display including the same to reduce or prevent non-emissive areas from being seen in a lattice form. The organic light emitting display device includes a plurality of anode electrodes on a lower substrate, a bank dividing the plurality of anode electrodes and covering an edge of each of the plurality of anode electrodes, an organic light emitting layer on the plurality of anode electrodes, a second electrode on the organic light emitting layer, and a scattering layer overlapping the bank.

9 Claims, 11 Drawing Sheets

(56) References Cited

U.S. PATENT DOCUMENTS

| | | | |
|---|---|---|---|
| 2013/0161631 A1* | 6/2013 | Lee | H01L 29/66765 |
| | | | 257/71 |
| 2013/0168644 A1 | 7/2013 | Park | |
| 2013/0299785 A1 | 11/2013 | Kim et al. | |
| 2013/0320842 A1* | 12/2013 | Park | H05B 33/12 |
| | | | 313/512 |
| 2014/0110690 A1* | 4/2014 | Yagi | H01L 51/5268 |
| | | | 257/40 |
| 2014/0198193 A1* | 7/2014 | Yamamoto | G09G 3/003 |
| | | | 348/54 |
| 2014/0284571 A1* | 9/2014 | Nomura | H01L 27/0248 |
| | | | 257/40 |
| 2014/0312339 A1* | 10/2014 | Fujita | H01L 27/322 |
| | | | 257/40 |
| 2015/0037916 A1* | 2/2015 | Rohatgi | H01L 51/524 |
| | | | 438/28 |
| 2015/0171372 A1* | 6/2015 | Iwata | C09D 5/22 |
| | | | 257/40 |
| 2015/0255754 A1 | 9/2015 | Moon et al. | |
| 2015/0340412 A1 | 11/2015 | Lee et al. | |
| 2016/0049612 A1 | 2/2016 | Kim et al. | |
| 2016/0334553 A1* | 11/2016 | Wu | G02F 1/1335 |
| 2017/0154930 A1* | 6/2017 | Kim | G02B 5/0294 |

FOREIGN PATENT DOCUMENTS

| | | |
|---|---|---|
| JP | 2011112828 A | 6/2011 |
| KR | 20150125207 A | 11/2015 |
| WO | 2016/124537 A1 | 8/2016 |

\* cited by examiner

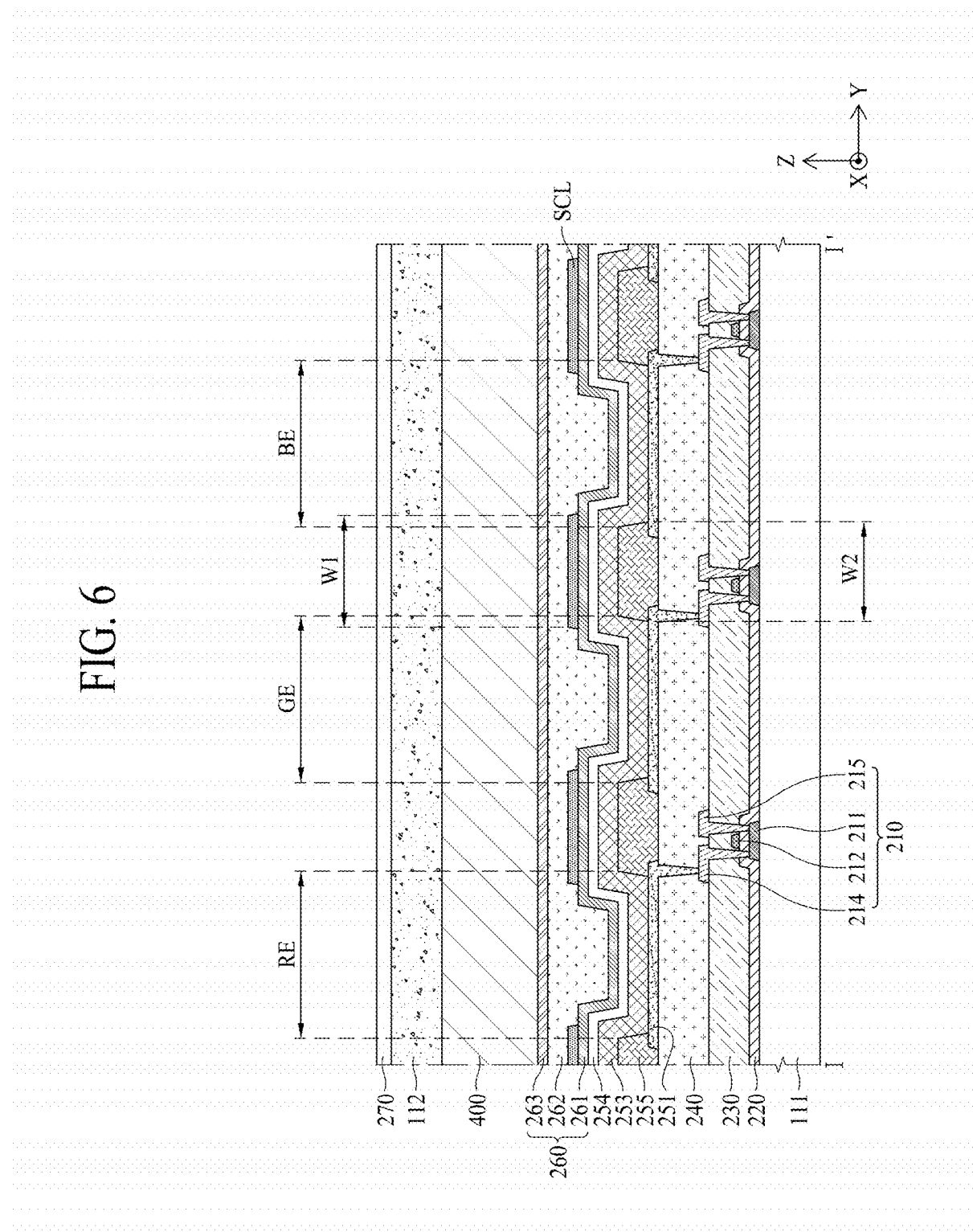

ORGANIC LIGHT EMITTING DISPLAY DEVICE AND HEAD-MOUNTED DISPLAY INCLUDING THE SAME

CROSS-REFERENCE TO RELATED APPLICATIONS

This application claims the benefit of Korean Patent Application No. 10-2010-0169365 filed on Nov. 30, 2015, which is hereby incorporated by reference as if fully set forth herein.

BACKGROUND

Field of the Invention

The present invention relates to an organic light emitting display device, a head-mounted display including the same, and a method of manufacturing the same.

Discussion of the Related Art

With the advancement of information-oriented society, various requirements for display devices for displaying an image are increasing. Various types of display devices such as liquid crystal display (LCD) devices, plasma display panel (PDP) devices, organic light emitting display devices, etc. are being used recently.

Organic light emitting display devices are a self-emitting display device and have advantages in viewing angle and contrast ratio compared to LCD devices. Also, since organic light emitting display devices do not need a separate backlight, organic light emitting display devices can be manufactured to be slim profile and lightweight, and are also excellent in power consumption. Furthermore, organic light emitting display devices can be driven with low direct current (DC) voltage, have fast response time, and are low in manufacturing costs.

An organic light emitting display device typically includes anode electrodes, a bank that divides the anode electrodes, a hole transporting layer, an organic light emitting layer, and an electron transporting layer that are formed on the anode electrodes, and a cathode electrode formed on the electron transporting layer. In this case, when a high-level voltage is applied to the anode electrode and a low-level voltage is applied to the cathode electrode, a hole and an electron respectively move to the organic light emitting layer through the hole transporting layer and the electron transporting layer and are combined with each other in the organic light emitting layer to emit light. Also, the organic light emitting display device may further include a black matrix overlapping with the bank to prevent colors from being mixed.

Head-mounted displays including an organic light emitting display device are being recently developed. Head-mounted displays are glasses-type monitor devices for virtual reality (VR) or augmented reality (AR), which are worn in a glasses type or a helmet type and form a focal point at a distance close to the eyes of a user.

In such a head-mounted display, an image displayed by the organic light emitting display device is seen just in front of the eyes of the user, and thus, the black matrix may be seen in a lattice pattern, as illustrated in FIG. 1.

SUMMARY

Accordingly, the present invention is directed to an organic light emitting display device, a head-mounted display including the same and a method of manufacturing the same that substantially obviate one or more problems due to limitations and disadvantages of the related art.

An advantage of the present invention is to provide an organic light emitting display device and a head-mounted display including the same, which is capable of reducing or preventing non-emissive areas from being seen in a lattice form.

Additional advantages and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these and other advantages and in accordance with the purpose of the invention, as embodied and broadly described herein, there is provided an organic light emitting display device including a plurality of anode electrodes on a lower substrate, a bank dividing the plurality of anode electrodes and covering an edge of each of the plurality of anode electrodes, an organic light emitting layer on the plurality of anode electrodes, a second electrode on the organic light emitting layer, and a scattering layer overlapping the bank.

In another aspect of the present invention, there is provided a head-mounted display including an organic light emitting display device displaying an image, an organic light emitting display device displaying an image; a left-eye lens and a right-eye lens receiving the image displayed by the organic light emitting display device, wherein the organic light emitting display device comprises: a plurality of anode electrodes on a lower substrate; a bank dividing the plurality of anode electrodes and covering an edge of each of the plurality of anode electrodes; an organic light emitting layer on the plurality of anode electrodes; a second electrode on the organic light emitting layer; and a scattering layer overlapping the bank.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention. In the drawings:

FIG. 6 is a cross-sectional view illustrating an example of one cross-sectional surface of FIG. 3;

DETAILED DESCRIPTION OF THE ILLUSTRATED EMBODIMENTS

Figure 1:
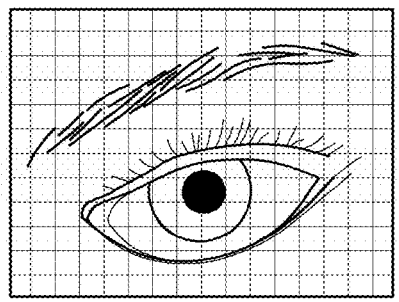
FIG. 1 is an exemplary diagram for describing a case where non-emissive areas are seen in a lattice pattern.

Reference will now be made in detail to exemplary embodiments of the present invention, examples of which are illustrated in the accompanying drawings. Wherever possible, the same reference numbers will be used throughout the drawings to refer to the same or like parts.

Advantages and features of the present invention, and implementation methods thereof will be clarified through following embodiments described with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Further, the present invention is only defined by scopes of claims.

A shape, a size, a ratio, an angle, and a number disclosed in the drawings for describing embodiments of the present invention are merely an example, and thus, the present invention is not limited to the illustrated details. Like reference numerals refer to like elements throughout. In the following description, when the detailed description of the relevant known function or configuration is determined to unnecessarily obscure the important point of the present invention, the detailed description will be omitted.

In a case where 'comprise', 'have', and 'include' described in the present specification are used, another part may be added unless 'only~' is used. The terms of a singular form may include plural forms unless referred to the contrary.

In construing an element, the element is construed as including an error range although there is no explicit description.

In describing a position relationship, for example, when a position relation between two parts is described as 'on~', 'over~', 'under~', and 'next~', one or more other parts may be disposed between the two parts unless 'just' or 'direct' is used.

In describing a time relationship, for example, when the temporal order is described as 'after~', 'subsequent~', 'next~', and 'before~', a case which is not continuous may be included unless 'just' or 'direct' is used.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of the present invention.

An X axis direction, a Y axis direction, and a Z axis direction should not be construed as only a geometric relationship where a relationship therebetween is vertical, and may denote having a broader directionality within a scope where elements of the present invention operate functionally.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

Features of various embodiments of the present invention may be partially or overall coupled to or combined with each other, and may be variously inter-operated with each other and driven technically as those skilled in the art can sufficiently understand. The embodiments of the present invention may be carried out independently from each other, or may be carried out together in co-dependent relationship.

Hereinafter, exemplary embodiments of the present invention will be described in detail with reference to the accompanying drawings.

Figure 2:
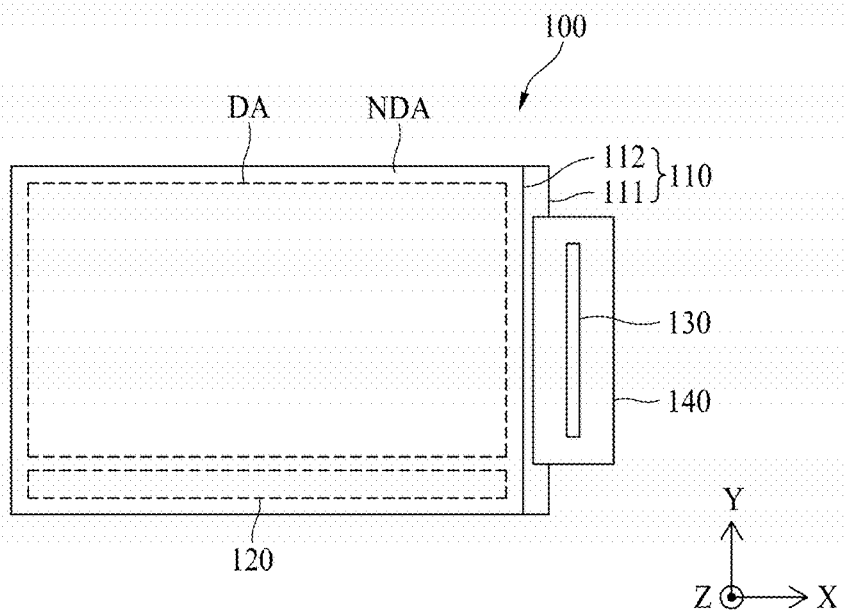
FIG. 2 is a plan view illustrating an organic light emitting display device according to an embodiment of the present invention.

FIG. 2 is a plan view illustrating an organic light emitting display device 100 according to an embodiment of the present invention.

Referring to FIG. 2, the organic light emitting display device 100 according to an embodiment of the present invention may include a display panel 110, a gate driver 120, a display driver 130, and a flexible film 140. The display panel 110 may include a lower substrate 111 and an upper substrate 112. The upper substrate 112 may be an encapsulation substrate. The lower substrate 111 may be larger than the upper substrate 112, and thus, a portion of the lower substrate 111 may be exposed without being covered by the upper substrate 112.

A plurality of gate lines, a plurality of data lines, and a plurality of emissive areas may be provided in a display area DA of the display panel 110. The plurality of gate lines and the plurality of data lines may be arranged to cross each other. For example, the gate lines may be arranged in a Y-axis direction, and the data lines may be arranged in an X-axis direction. The plurality of emissive areas may be respectively provided in areas defined by the crossings of the gate lines and the data lines. The emissive areas of the display area DA may display an image. The display area DA will be described in detail with reference to FIGS. 3 and 4.

The gate driver 120 may sequentially supply gate signals to the gate lines according to a gate control signal input from the display driver 130. The gate driver 120 may be provided in a non-display area NDA outside one side of the display area DA of the display panel 110 in a gate driver in-panel (GIP) type. Alternatively, the gate driver 120 may be manufactured as a driving chip and mounted on a flexible circuit. Alternatively, the gate driver 120 may be attached on the non-display area NDA outside one side of the display area DA of the display panel 110 in a tape automated bonding (TAB) type.

The display driver 130 may receive digital video data and timing signals from an external system board (not shown). The display driver 130 may generate a gate control signal for controlling an operation timing of the gate driver 120 and a source control signal for controlling the supply of data voltages to the data lines based on the timing signals. The display driver 130 may supply the gate control signal to the gate driver 120.

The display driver 130 may convert the digital video data into analog data voltages according to the source control signal and may respectively supply the analog data voltages to the data lines. If the display driver 130 is manufactured as a driving chip, the display driver 130 may be mounted on the flexible film 140 in a chip-on film (COF) type or a chip-on plastic (COP) type.

Since a size of the lower substrate 111 is larger than that of the upper substrate 112, a portion of the lower substrate 111 may be exposed without being covered by the upper substrate 112. A plurality of pads may be provided in the portion of the lower substrate 111 which is exposed without being covered by the upper substrate 112. The plurality of pads may include a plurality of data pads connected to the data lines and a plurality of gate pads connected to the gate driver 120. A plurality of conductive lines connecting the pads to the display driver 130 may be provided on the flexible film 140. The flexible film 140 may be attached on the pads by using an anisotropic conductive film, and thus, the pads may be connected to the conductive lines of the flexible film 140.

Figure 3:
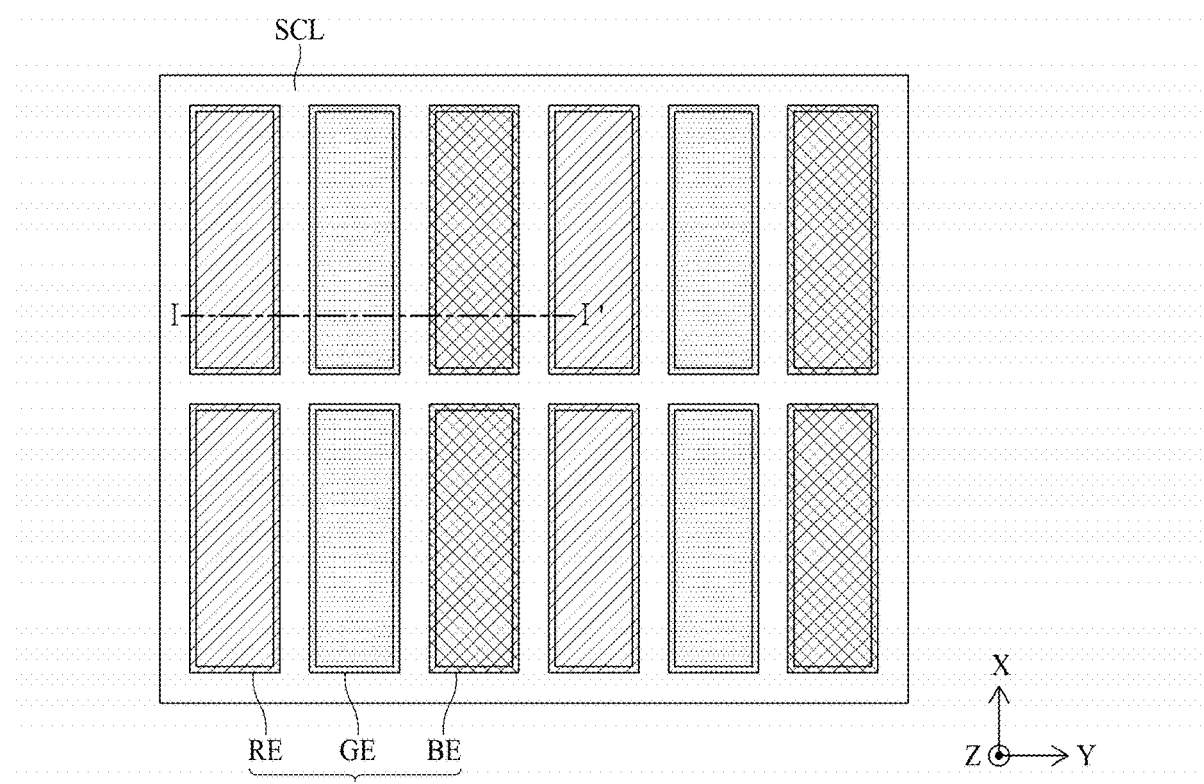
FIG. 3 is an exemplary diagram illustrating a portion of a display area illustrated in FIG. 2.

FIG. 3 is an exemplary diagram illustrating a portion of a display area illustrated in FIG. 2. In FIG. 3, for convenience of description, only a plurality of emissive areas RE, GE and BE and a scattering layer SCL are illustrated by way of example.

Referring to FIG. 3, in each of the emissive areas RE, GE and BE, an organic light emitting layer may emit certain light. The emissive areas RE, GE and BE may include a red emissive area RE emitting red light, a green emissive area GE emitting green light, and a blue emissive area BE emitting blue light. In this case, the red emissive area RE, the green emissive area GE, and the blue emissive area BE may function as one pixel.

The emissive areas may further include a white emissive area emitting white light, in addition to the red emissive area RE, the green emissive area GE, and the blue emissive area BE. In this case, the red emissive area RE, the green emissive area GE, the blue emissive area BE, and the white emissive area may function as one pixel.

The emissive areas RE, GE and BE may be divided by a bank disposed between the emissive areas RE, GE and BE.

The scattering layer SCL may scatter the light emitted from the organic light emitting layer of each of the emissive areas RE, GE and BE. The scattering layer SCL may be formed on the bank, and a width of the scattering layer SCL may be wider than that of the bank. Therefore, the scattering layer SCL may overlap a partial region of each of the emissive areas RE, GE and BE at a border of a corresponding emissive area. Hereinafter, a position at which the scattering layer SCL according to embodiments of the present invention is formed will be described in detail with reference to FIGS. 4 and 6 to 8.

Figure 4:
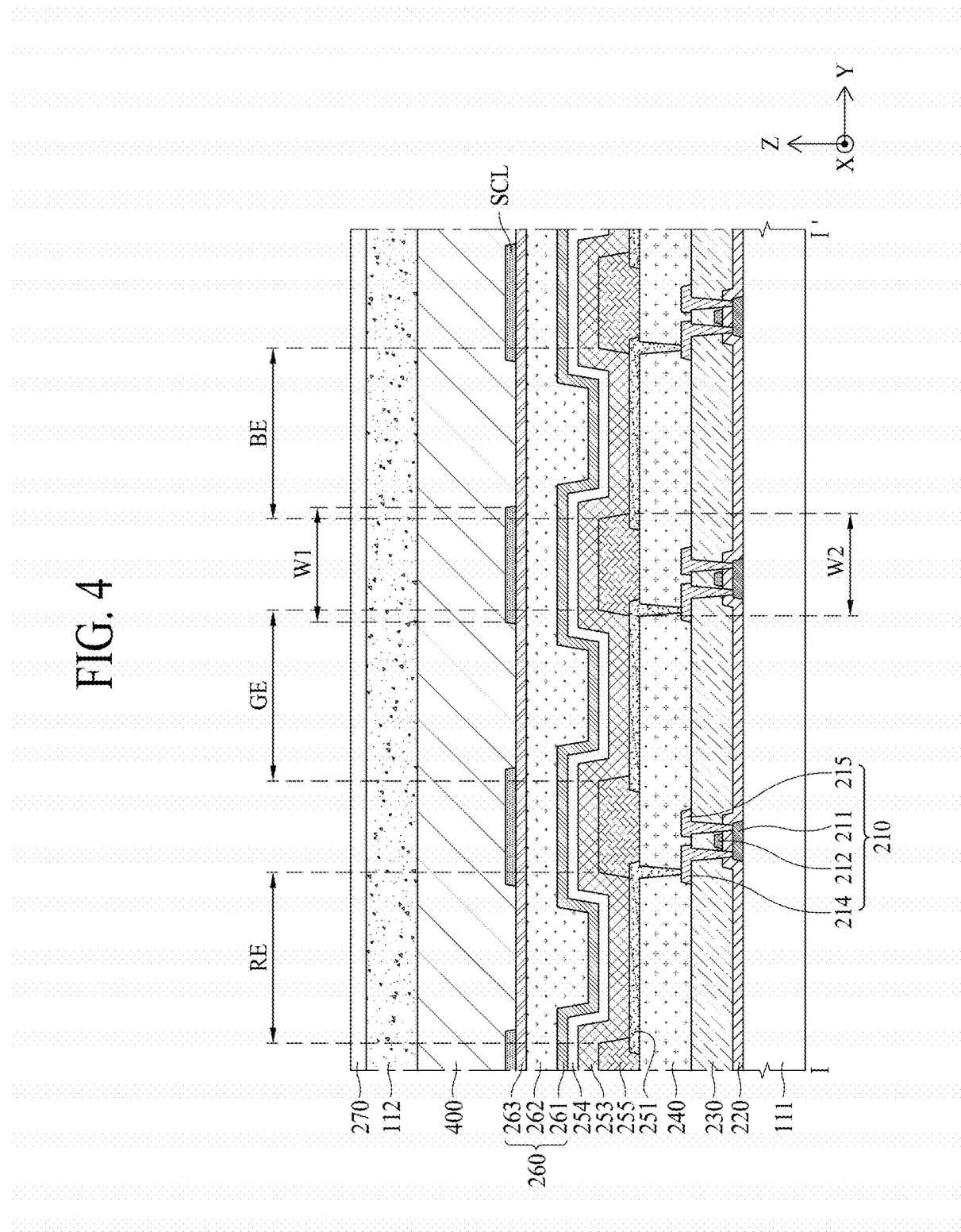
FIG. 4 is a cross-sectional view taken along line I-I' of FIG. 3.

FIG. 4 is a cross-sectional view illustrating an example of a cross-sectional surface taken along line I-I' of FIG. 3.

Referring to FIG. 4, a plurality of thin film transistors (TFTs) 210 may be formed on the lower substrate 111. Each of the TFTs 210 may include a semiconductor layer 211, a gate electrode 212, a source electrode 215, and a drain electrode 214. FIG. 4 illustrates that the TFTs 210 are formed in a top gate type where the gate electrode 212 is disposed on the semiconductor layer 211, but the present embodiment is not limited thereto. For example, the TFTs 210 may be formed in a bottom gate type where the gate electrode 212 is disposed under the semiconductor layer 211, or may be formed in a double gate type where a plurality of the gate electrodes 212 are disposed on and under the semiconductor layer 211.

The semiconductor layer 211 may be provided in plurality on the lower substrate 111. A buffer layer (not shown), which protects the plurality of semiconductor layers 211 and increases an interface adhesive force of the plurality of semiconductor layers 211, may be formed between the lower substrate 111 and the plurality of semiconductor layers 211. The buffer layer (not shown) may include a plurality of inorganic layers. An interlayer insulation layer 220 may be formed on the plurality of semiconductor layers 211. The gate electrode 212 may be provided in plurality on the interlayer insulation layer 220. A gate insulation layer 230 may be formed on the plurality of gate electrodes 212. Each of the source electrode 215 and the drain electrodes 214 may be provided in plurality on the gate insulation layer 230. Each of the source electrodes 215 and the drain electrodes 214 may be connected to the semiconductor layer 211 through a contact hole that passes through the interlay insulation layer 220 and the gate insulation layer 230.

A planarization layer 240 may be formed on the source electrodes 215 and the drain electrodes 214. The planarization layer 240 is to planarly arrange pixels divided by a plurality of banks 255. The planarization layer 240 may be formed of a resin such as photo acryl, polyimide, and/or the like.

A plurality of organic light emitting devices may be formed on the planarization layer 240. The plurality of organic light emitting devices may each include an anode electrode 251, an organic light emitting layer 253, and a cathode electrode 254, and may be divided by the banks 255.

The anode electrode 251 may be provided in plurality on the planarization layer 240. Each of the anode electrodes 251 may be connected to the drain electrode 214 through a contact hole that passes through the planarization layer 240.

The anode electrodes 251 may be divided by the bank 255. The bank 255 may cover an edge of each of the anode electrodes 251.

The bank 255 may include a material that absorbs light. For example, the bank 255 may be a black bank. Also, since the bank 255 may include a material that absorbs light, a black matrix may be formed on the bank 255.

The organic light emitting layer 253 may be provided in plurality on the anode electrodes 251 and the banks 255. The organic light emitting layers 253 may include a hole transporting layer, a light emitting layer, and an electron transporting layer. In this case, when a voltage is applied to the anode electrode 251 and the cathode electrode 254, a hole and an electron may respectively move to the light emitting layer through the hole transporting layer and the electron transporting layer and may be combined with each other in the light emitting layer to emit light.

The organic light emitting layer 253 may include only a white light emitting layer emitting white light. In such a case, the white light emitting layer may be formed in a whole portion of the display area DA. Alternatively, the organic light emitting layers 253 may include a red light emitting layer emitting red light, a green light emitting layer emitting green light, and a blue light emitting layer emitting blue light. In such a case, the red light emitting layer may be formed in only the red emissive areas RE, the green light emitting layer may be formed in only the green emissive areas GE, and the blue light emitting layer may be formed in only the blue emissive areas BE.

The cathode electrode 254 may be formed on the organic light emitting layers 253 and the banks 255 to cover the organic light emitting layers 253 and the banks 255.

The organic light emitting display device may be implemented as a top emission type. In the top emission type, since the light emitted from the organic light emitting layer 253 is irradiated toward the upper substrate 112, the TFTs 210 may be widely provided under the bank 255 and the anode electrode 251. That is, an area occupied by the TFTs 210 is wider in the top emission type than a bottom emission type. Also, in the top emission type, the anode electrodes 251 may be formed of a metal material having a high reflectivity such as aluminum or a stacked structure including aluminum and indium tin oxide (ITO), so as to obtain a micro-cavity effect. Furthermore, in the top emission type, since the light emitted from the organic light emitting layer 253 is irradiated toward the upper substrate 112, the cathode electrode 254 may be formed of a transparent metal material, which transmits light, such as indium tin oxide (ITO), indium zinc oxide (IZO), and/or the like, or may be formed of a semitransparent metal material such as magnesium (Mg), silver (Ag), Mg:Ag, and/or the like.

An encapsulation layer 260 may be formed on the cathode electrode 254. The encapsulation layer 260 is to reduce or prevent oxygen or water from penetrating into the organic light emitting layer 253. To this end, the encapsulation layer 260 may include a first inorganic layer 261, an organic layer 262, and a second inorganic layer 263.

The first inorganic layer 261 may be formed on the cathode electrode 254 to cover the cathode electrode 254. The organic layer 262 may be formed on the first inorganic layer 261, so as to reduce or prevent particles from penetrating into the organic light emitting layer 253 and the cathode electrode 254 through the first inorganic layer 261. The second inorganic layer 263 may be formed on the organic layer 262 to cover the organic layer 262.

Each of the first and second inorganic layers 261 and 263 may be formed of silicon nitride, aluminum nitride, zirconium nitride, titanium nitride, hafnium nitride, tantalum nitride, silicon oxide, aluminum oxide, titanium oxide, and/or the like. For example, each of the first and second inorganic layers 261 and 263 may be formed of $SiO_2$, $Al_2O_3$, SiON, SiNx, and/or the like. The organic layer 262 may be transparent to transmit the light emitted from the organic light emitting layer 253.

The scattering layer SCL may be formed on the encapsulation layer 260. The scattering layer SCL may include a polarity of scattering particles for scattering light. The scattering particles may be a high refractive oxide metal such as $TiO_2$, $ZrO_2$, and/or the like. A size of the scattering particles may be 100 nm to 300 nm, and the scattering particles may be added into the scattering layer SCL by 5% to 30%. If the size of the scattering particles is less than 100 nm or the scattering particles are added into the scattering layer SCL by less than 5%, light scattering effect may be reduced. If the size of the scattering particles is greater than 300 nm or the scattering particles are added into the scattering layer SCL by more than 30%, light transmittance may be lowered.

The scattering layer SCL may be formed to overlap the bank 255. A width W1 of the scattering layer SCL may be wider than a width W2 of the bank 255. Therefore, the scattering layer SCL may overlap a partial region of each of the emissive areas RE, GE and BE at a border of a corresponding emissive area. As a result, since light is scattered at borders of the emissive areas RE, GE and BE, the bank 255 corresponding to a non-emissive area may be reduced or prevented from being seen due to the scattered light.

Figure 5A:
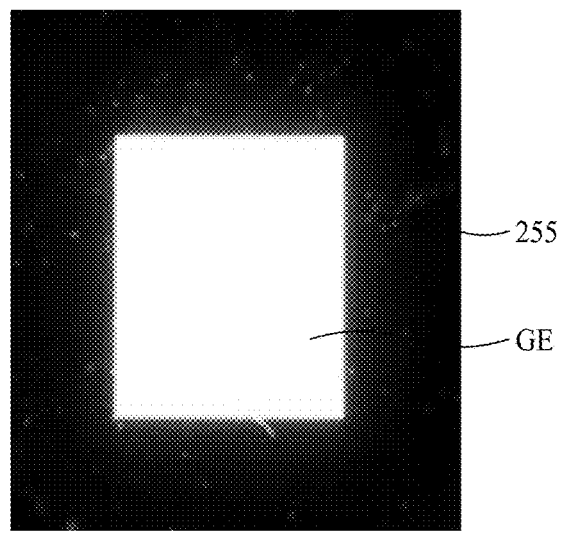
FIG. 5A is an exemplary diagram for describing a case where if a scattering layer is not provided, a bank corresponding to a non-emissive area is seen as-is.
Figure 5B:
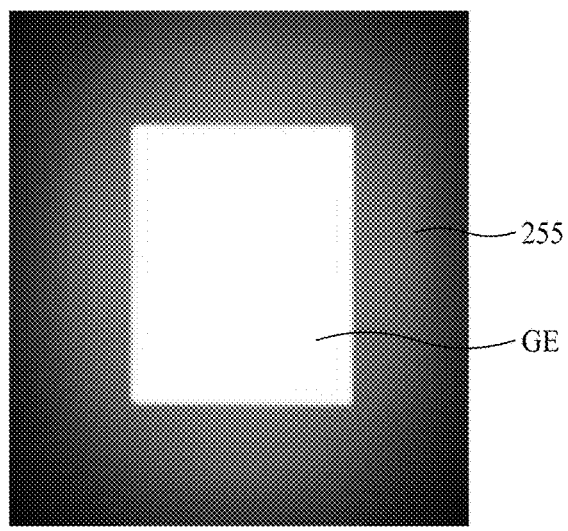
FIG. 5B is an exemplary diagram for describing a case where if a width of a scattering layer is wider than a width of a bank, the bank corresponding to a non-emissive area is hardly seen.

For example, as illustrated in FIG. 5A, if the scattering layer SCL is not provided, the light emitted from each of the emissive areas RE, GE and BE is emitted without being scattered, and thus, the bank 255 corresponding to the non-emissive area may be seen as-is. However, as illustrated in FIG. 5B, if the width W1 of the scattering layer SCL is wider than a width W2 of the bank 255, the light is scattered at borders of the emissive areas RE, GE and BE, and thus, the bank 255 corresponding to the non-emissive area may be hardly seen due to the scattered light. In FIGS. 5A and 5B, only the green emissive area GE among the emissive areas RE, GE and BE is illustrated by way of example for convenience of description.

As an area where the scattering layer SCL overlaps each of the emissive areas RE, GE and BE becomes wider, an amount of light scattered by the scattering layer SCL increases, thereby enhancing scattering effect of the scattering layer SCL. However, if the scattering effect of the scattering layer SCL increases excessively, a haze phenomenon where an image is dimly seen may occur. Therefore, the area where the scattering layer SCL overlaps each of the emissive areas RE, GE and BE may be determined through an experiment in advance.

Figure 7:
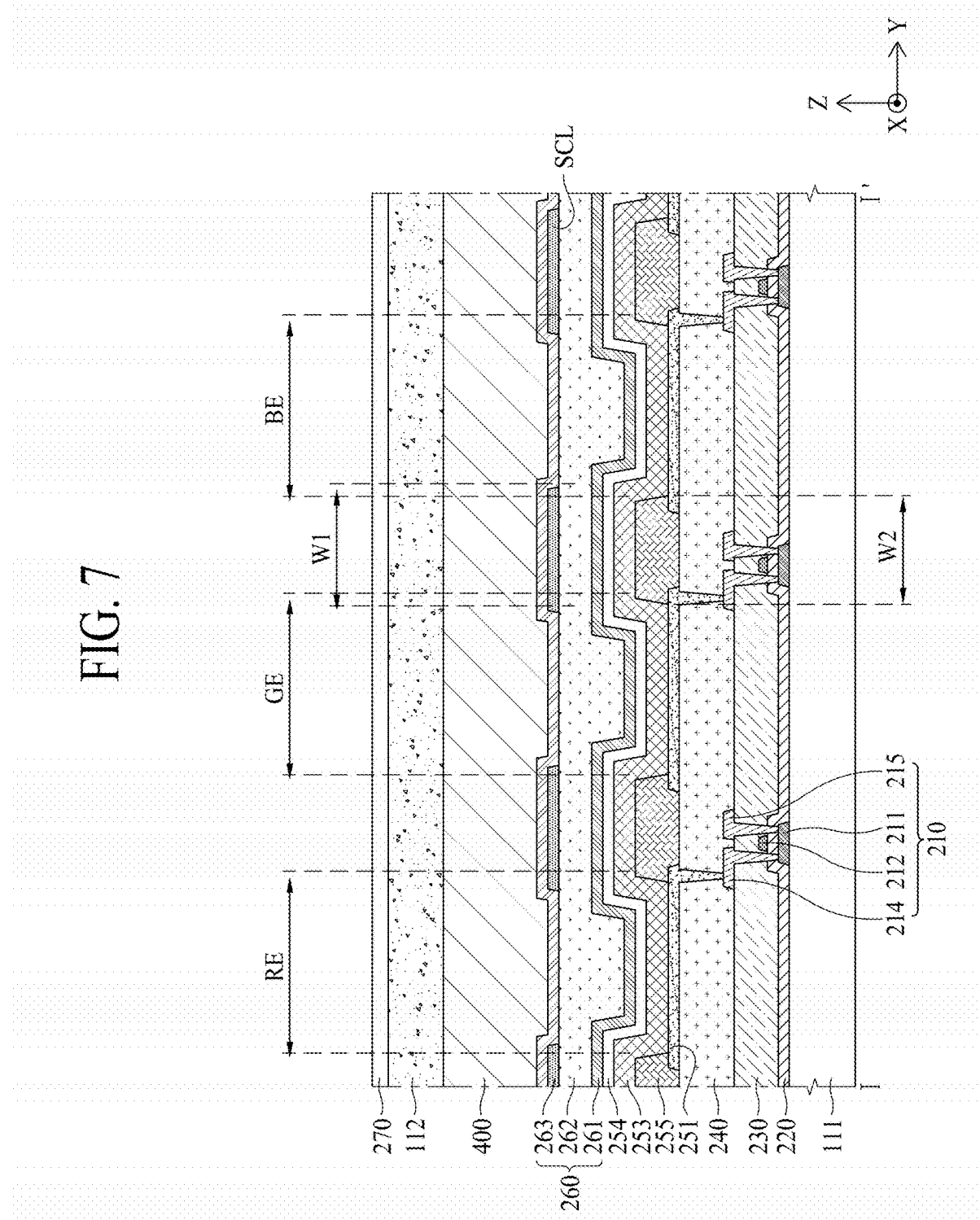
FIG. 7 is a cross-sectional view illustrating another example of one cross-sectional surface of FIG. 3.
Figure 8:
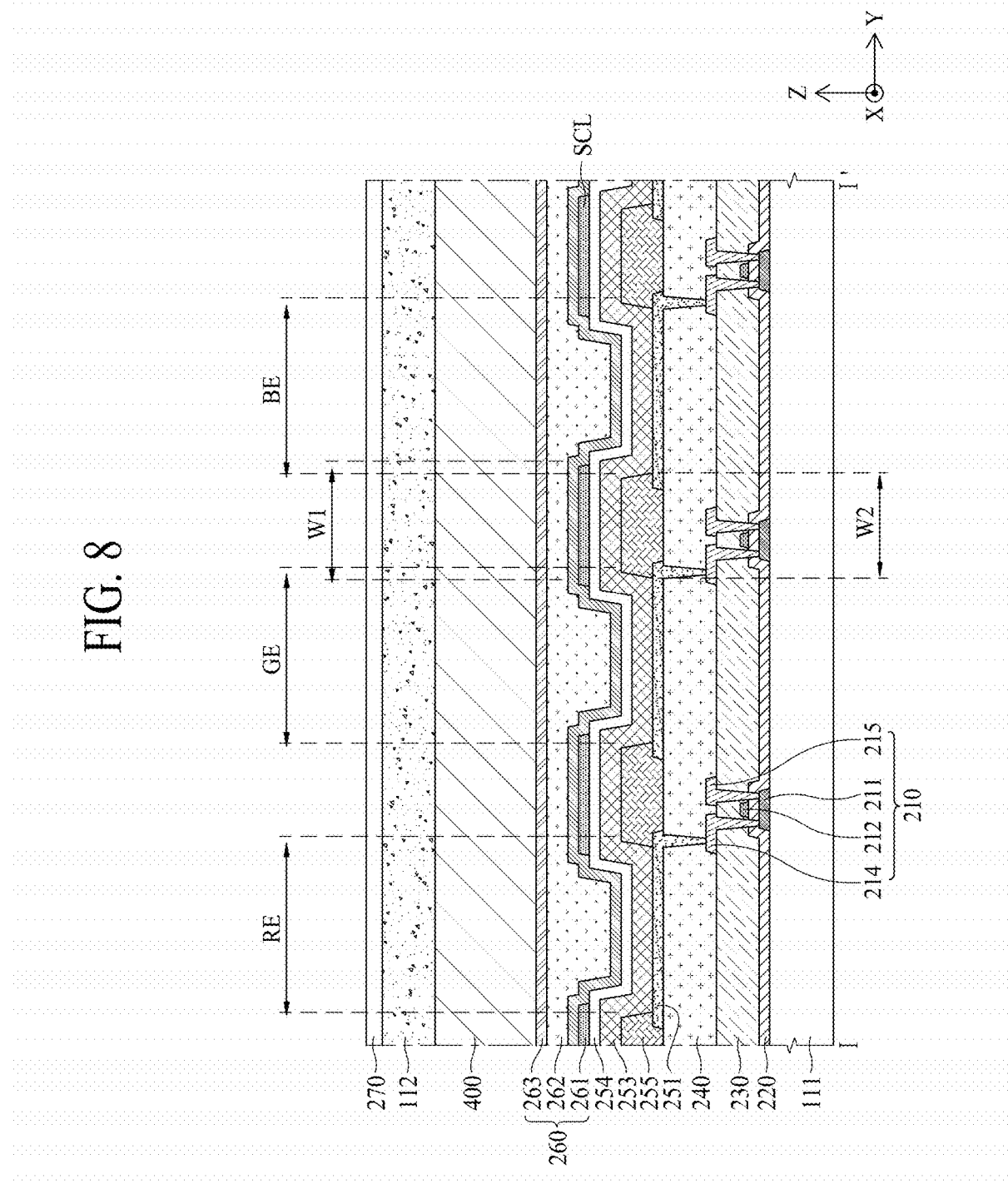
FIG. 8 is a cross-sectional view illustrating another example of one cross-sectional surface of FIG. 3.

Moreover, if the scattering layer SCL overlaps the bank 255, the scattering layer SCL may be formed on another layer or another film between the bank 255 and the second substrate 112, in addition to the encapsulation layer 260. That is, the scattering layer SCL may be formed in the encapsulation layer 260. For example, the scattering layer SCL may be formed on the organic layer 262 of the encapsulation layer 260 as illustrated in FIG. 7, or may be formed on the first inorganic layer 261 of the encapsulation layer 260 as illustrated in FIG. 6. Alternatively, the scattering layer SCL may be formed on the cathode electrode 254 as illustrated in FIG. 8. Alternatively, the scattering layer SCL may be formed on the upper substrate 112, but in this case, alignment may be needed when bonding the lower substrate 111 to the upper substrate 112.

The lower substrate 111 and the upper substrate 112 may be bonded to each other by a transparent adhesive layer 400. The transparent adhesive layer 400 may be a transparent adhesive resin. In detail, the transparent adhesive layer 400 may bond the second inorganic layer 263 of the lower substrate 111 to the upper substrate 112.

A polarizer 270 may be adhered to the upper substrate 112. The polarizer 270 may reduce or prevent external light from being reflected toward the user by the anode electrodes 251 and the cathode electrode 254 of the lower substrate 111. That is, since the polarizer 270 is adhered to the upper substrate 112, visibility of an image displayed by the emissive areas RE, GE and BE may be reduced or prevented from being reduced due to external light according to an embodiment of the present invention.

As described above, the scattering layer SCL may be formed to overlap the bank 255 on or in the encapsulation layer 260 or on the cathode electrode 254 according to an embodiment of the present invention. Particularly, the width W1 of the scattering layer SCL may be wider than the width W2 of the bank 255. As a result, light is scattered at the borders of the emissive areas RE, GE and BE, and thus, the bank 255 corresponding to the non-emissive area may be hardly seen due to the scattered light. Accordingly, even when the organic light emitting display device according to an embodiment of the present invention is applied to a head-mounted display, the non-emissive areas are not seen in a lattice form. A head-mounted display will be described in detail with reference to FIGS. 10A, 10B, 11 and 12.

Figure 9:
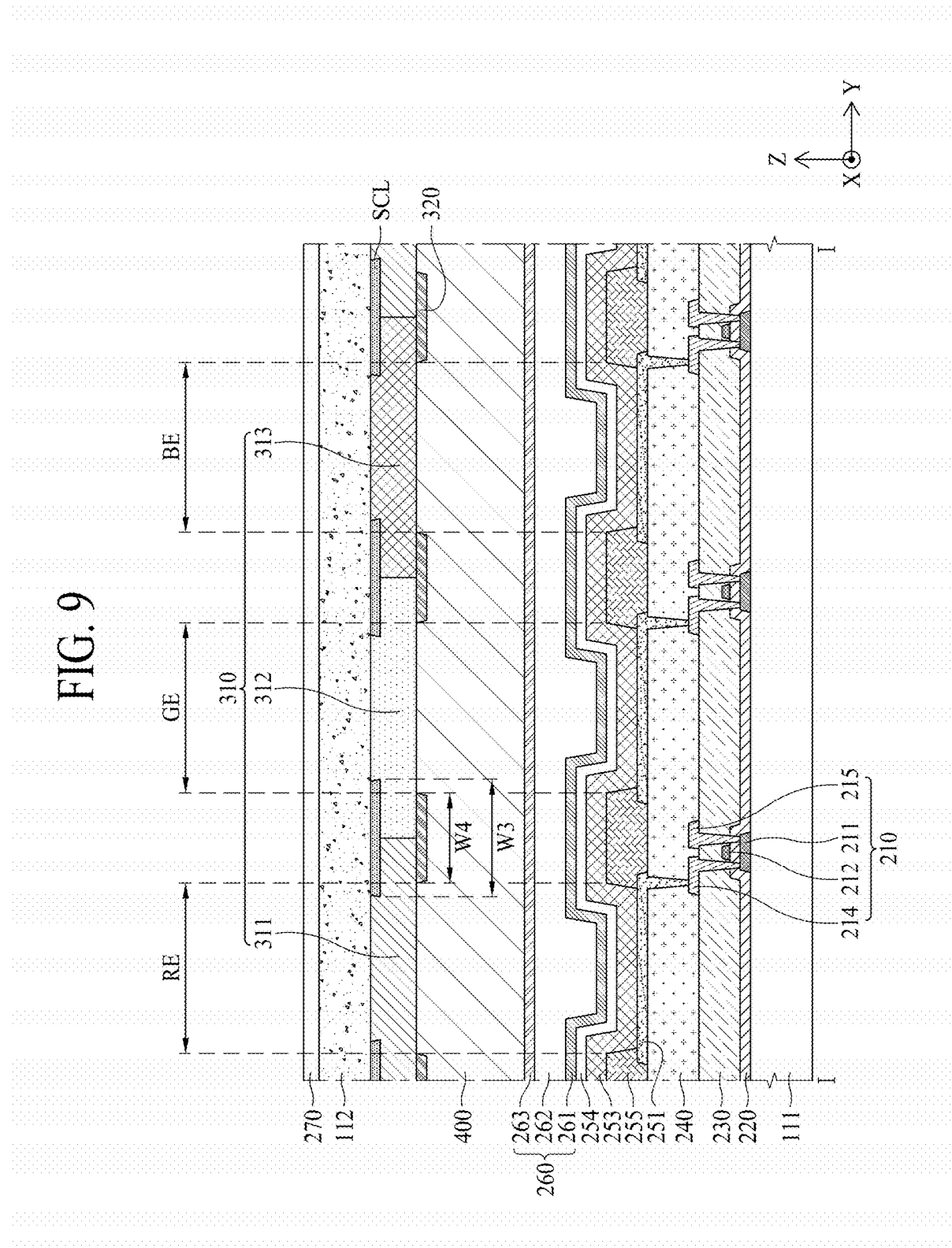
FIG. 9 is a cross-sectional view illustrating another example of a cross-sectional surface taken along line I-I' of FIG. 3.

FIG. 9 is a cross-sectional view illustrating another example of a cross-sectional surface taken along line I-I' of FIG. 3. Except for a bank 255, a plurality of color filters 310, a black matrix 320, a transparent adhesive layer 400, a scattering layer SCL and other elements illustrated in FIG. 9 are substantially the same as the elements described above with reference to FIG. 4. For convenience of description, detailed description of the duplicative elements will be omitted.

A bank 255 may divide a plurality of anode electrodes 251. The bank 255 may be formed to cover an edge of each of the anode electrodes 251. In FIG. 9, a black matrix 320 may be formed on an upper substrate 112, and thus, the bank 255 may not include a material absorbing light.

The color filters 310 may be formed on the upper substrate 112 facing a lower substrate 111. The color filters 310 may be arranged in correspondence with a plurality of emissive areas RE, GE and BE. The color filters 310 may include a plurality of red color filters 311, a plurality of green color filters 312, and a plurality of blue color filters 313. In this case, each of the red color filters 311 may be disposed in correspondence with the red emissive area RE, each of the green color filters 312 may be disposed in correspondence with the green emissive area GE, and each of the blue color filters 313 may be disposed in correspondence with the blue emissive area BE.

A black matrix 320 may be formed at a boundary of the color filters 310 and on the color filters 310. Also, the black matrix 320 may be disposed to overlap the bank 255. The black matrix 320 may include a material absorbing light. The black matrix 320 may reduce or prevent colors from being mixed due to the light emitted from adjacent emissive areas.

A scattering layer SCL may be disposed between the color filters 310 and the upper substrate 112. The scattering layer SCL may include a plurality of scattering particles for scattering light. The scattering particles may be a high refractive oxide metal such as $TiO_2$, $ZrO_2$, and/or the like. A size of the scattering particles may be 100 nm to 300 nm, and the scattering particles may be added into the scattering layer SCL by 5% to 30%. If the size of the scattering particles is less than 100 nm or the scattering particles are added into the scattering layer SCL by less than 5%, light scattering effect may be reduced. If the size of the scattering particles is greater than 300 nm or the scattering particles are added into the scattering layer SCL by more than 30%, light transmittance may be lowered.

The scattering layer SCL may be formed to overlap the bank 255. Also, the scattering layer SCL may be formed to overlap the black matrix 320. A width W3 of the scattering layer SCL may be wider than a width W4 of the black matrix 320. Therefore, the scattering layer SCL may overlap a partial region of each of the emissive areas RE, GE and BE at a border of a corresponding emissive area. As a result, since light is scattered at borders of the emissive areas RE, GE and BE, the black matrix 320 corresponding to a non-emissive area may be reduced or prevented from being seen due to the scattered light.

As an area where the scattering layer SCL overlaps each of the emissive areas RE, GE and BE becomes wider, an amount of light scattered by the scattering layer SCL increases, thereby enhancing scattering effect of the scattering layer SCL. However, if the scattering effect of the scattering layer SCL increases excessively, a haze phenomenon where an image is dimly seen may occur. Therefore, the area where the scattering layer SCL overlaps each of the emissive areas RE, GE and BE may be determined through an experiment in advance.

The lower substrate 111 and the upper substrate 112 may be bonded to each other by a transparent adhesive layer 400. The transparent adhesive layer 400 may be a transparent adhesive resin. In detail, the transparent adhesive layer 400 may bond a second inorganic layer 263 of the lower substrate 111 to the color filters 310 of the upper substrate 112.

The color filters 310 may reduce or prevent external light from being reflected toward the user by a plurality of anode electrodes 251 and a cathode electrode 254 disposed on the lower substrate 111, and thus, the polarizer 270 may not be adhered to the upper substrate 112.

As described above, the scattering layer SCL may be formed to overlap the black matrix 320 between the upper substrate 112 and the color filters 310 according to an embodiment of the present invention. Particularly, the width W3 of the scattering layer SCL may be wider than the width W4 of the black matrix 320. As a result, light is scattered at the borders of the emissive areas RE, GE and BE, and thus, the black matrix 320 corresponding to the non-emissive area may be hardly seen due to the scattered light. Accordingly, even when the organic light emitting display device according to an embodiment of the present invention is applied to a head-mounted display, the non-emissive areas may not be seen in a lattice form. The head-mounted display will be described in detail with reference to FIGS. 10A, 10B, 11 and 12.

Figure 10A:
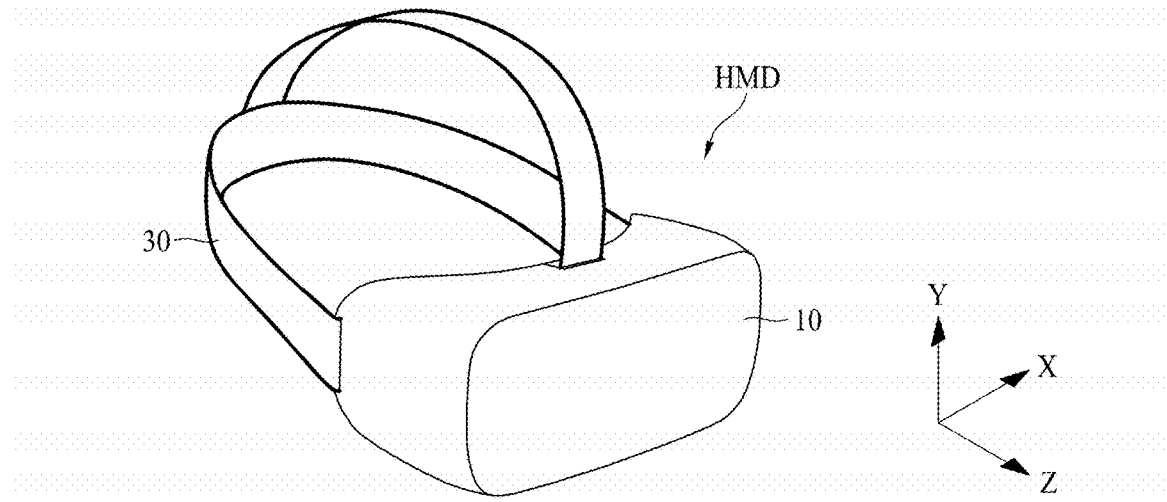
FIGS. 10A and 10B are exemplary diagrams illustrating a head-mounted display according to an embodiment of the present invention.
Figure 10B:
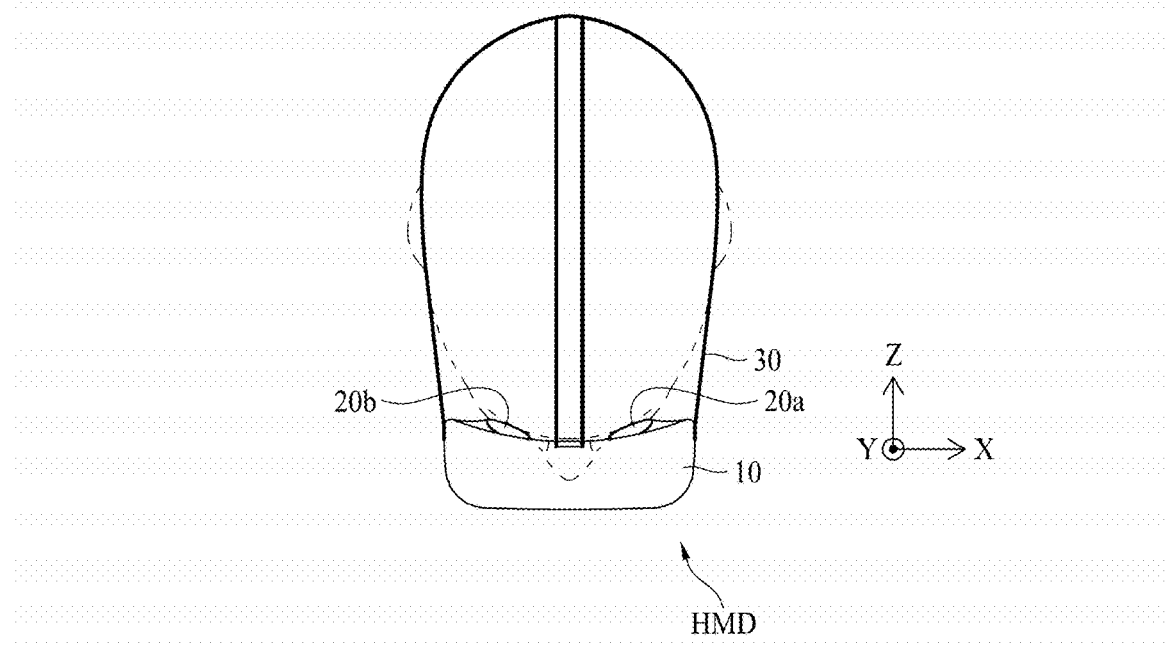

FIGS. 10A and 10B are exemplary diagrams illustrating a head-mounted display HMD according to an embodiment of the present invention.

Referring to FIGS. 10A and 10B, the head-mounted display HMD according to an embodiment of the present invention may include a display accommodating case 10, a left-eye lens 20a, a right-eye lens 20b, and a head-mountable band 30.

The display accommodating case 10 may accommodate a display device and may supply an image displayed by the display device to the left-eye lens 20a and the right-eye lens 20b. The display device may be an organic light emitting display device according to an embodiment of the present invention. The organic light emitting display device according to an embodiment of the present invention has been described in detail with reference to FIGS. 2 to 9.

The display accommodating case 10 may be designed to supply the same image to the left-eye lens 20a and the right-eye lens 20b. Alternatively, the display accommodating case 10 may be designed so that a left-eye image is displayed on the left-eye lens 20a and a right-eye image is displayed on the right-eye lens 20b.

Figure 11:
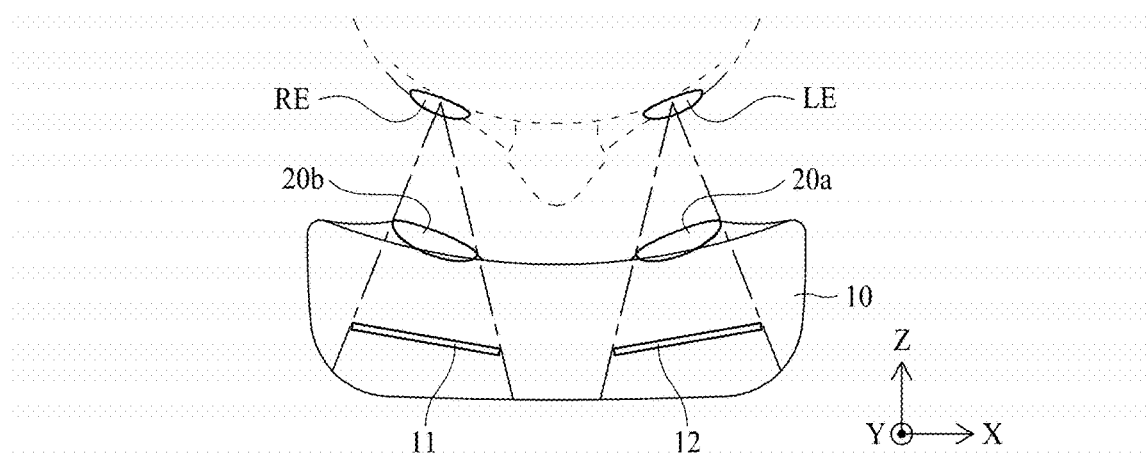
FIG. 11 is a cross-sectional view when a display accommodating case is seen from above.

As illustrated in FIG. 11, a left-eye organic light emitting display device 12 disposed in front of the left-eye lens 20a and a right-eye organic light emitting display device 11 disposed in front of the right-eye lens 20b may be accommodated into the display accommodating case 10. FIG. 11 illustrates a cross-sectional view when the display accommodating case 10 is seen from above. The left-eye organic light emitting display device 12 may display the left-eye image, and the right-eye organic light emitting display device 11 may display the right-eye image. The left-eye image displayed by the left-eye organic light emitting display device 12 may be seen to the left eye LE of the user through the left-eye lens 20a, and the right-eye image displayed by the right-eye organic light emitting display device 11 may be seen to the right eye RE of the user through the right-eye lens 20b.

Figure 12:
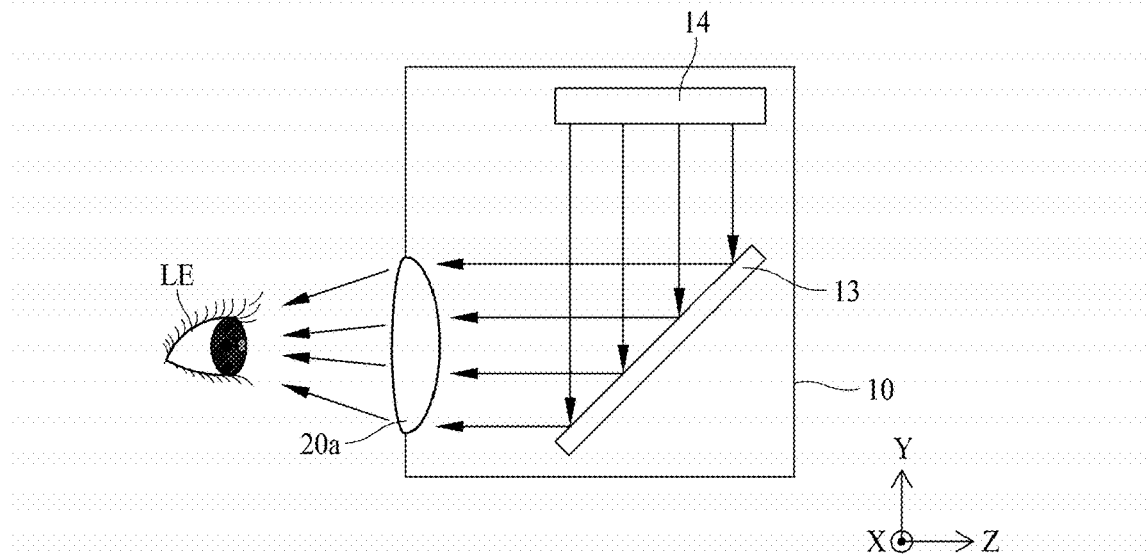
FIG. 12 illustrates a cross-sectional view when a display accommodating case is seen from side.

As illustrated in FIG. 12, a half mirror 13 disposed in front of the left-eye lens 20a and the right-eye lens 20b and an organic light emitting display device 14 disposed on the half mirror 13 may be accommodated into the display accommodating case 10. FIG. 12 illustrates a cross-sectional view when the display accommodating case 10 is seen from a side. The organic light emitting display device 14 may display an image toward the half mirror 13, and the half mirror 13 may totally reflect the image displayed by the organic light emitting display device 14 toward the left-eye lens 20a and the right-eye lens 20b. Therefore, the image displayed by the organic light emitting display device 14 may be supplied to the left-eye lens 20a and the right-eye lens 20b. In FIG. 12, only the left-eye lens 20a and the left eye LE of the user are illustrated by way of example for convenience of description.

The left-eye lens 20a and the right-eye lens 20b may be disposed on one side of the display accommodating case 10. The left-eye lens 20a and the right-eye lens 20b may be disposed in order for the user to look at the inside of the display accommodating case 10. The left eye of the user may be located over the left-eye lens 20a, and the right eye of the user may be located over the left-eye lens 20b.

The left-eye lens 20a and the right-eye lens 20b may each be a convex lens. In this case, due to the left-eye lens 20a and the right-eye lens 20b, an image displayed on the display accommodating case 10 is enlarged and seen to the user. Alternatively, the left-eye lens 20a and the right-eye lens 20b may not have a function of enlarging or reducing the image displayed on the display accommodating case 10.

The head-mountable band 30 may be fixed to the display accommodating case 10. The head-mountable band 30 is illustrated as being provided to surround a top and both sides of the user by way of example, but is not limited thereto. For example, the head-mountable band 30 may fix the head-mounted display to the head of the user and may be implemented as a glasses type or a helmet type.

Figure 13:
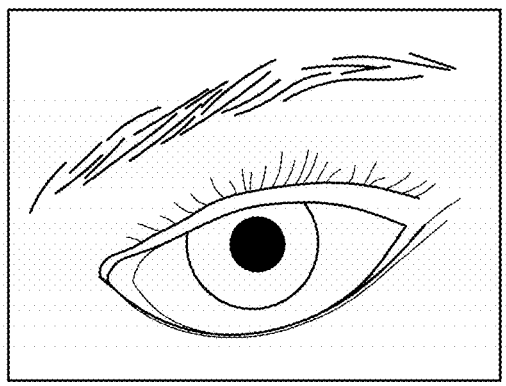
FIG. 13 is an exemplary diagram for describing a case where a head-mounted display according to an embodiment of the present invention reduces or prevents non-emissive areas of an organic light emitting display device from being seen in a lattice pattern.

In the related art head-mounted display, an image displayed by an organic light emitting display device is seen just in front of the eyes of the user, and thus, non-emissive areas are seen in a lattice pattern, as illustrated in FIG. 1. On the other hand, in the head-mounted display according to an embodiment of the present invention, the scattering layer SCL may be formed to overlap the bank 255 on or in the encapsulation layer 260 or on the cathode electrode 254, and the width W1 of the scattering layer SCL may be wider than the width W2 of the bank 255. As a result, light is scattered at the borders of the emissive areas RE, GE and BE, and thus, the bank 255 corresponding to the non-emissive area may be hardly seen due to the scattered light. Accordingly, the head-mounted display according to an embodiment of the present invention may reduce or prevent the non-emissive areas of the organic light emitting display device from being seen in a lattice form, as illustrated in FIG. 13.

Moreover, the head-mounted display according to an embodiment of the present invention may include an organic light emitting display device in which the scattering layer SCL is formed to overlap the black matrix 320 between the upper substrate 112 and the color filters 310, and the width W3 of the scattering layer SCL may be wider than the width W4 of the black matrix 320. As a result, light is scattered at the borders of the emissive areas RE, GE and BE, and thus, the bank 255 corresponding to the non-emissive area may be hardly seen due to the scattered light. Accordingly, the head-mounted display according to an embodiment of the present invention may reduce or prevent the non-emissive areas of the organic light emitting display device from being seen in a lattice form, as illustrated in FIG. 13.

As described above, the scattering layer may be formed to overlap the bank on or in the encapsulation layer or on the cathode electrode, and the width of the scattering layer may be wider than the width of the bank according to the head-mounted display according to an embodiment of the present invention. As a result, light is scattered at the borders of the emissive areas, and thus, the bank corresponding to the non-emissive area may be hardly seen due to the scattered light. Accordingly, the head-mounted display according to an embodiment of the present invention may reduce or prevent the non-emissive areas of the organic light emitting display device from being seen in a lattice form.

Moreover, the scattering layer may be formed to overlap the black matrix between the upper substrate and the color filters according to an embodiment of the present invention. Particularly, the width of the scattering layer may be wider than the width of the black matrix. As a result, light is scattered at the borders of the emissive areas, and thus, the bank corresponding to the non-emissive area may be hardly seen due to the scattered light. Accordingly, the head-mounted display according to an embodiment of the present invention may reduce or prevent the non-emissive areas of the organic light emitting display device from being seen in a lattice form.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:
1. An organic light emitting display device comprising:
a plurality of anode electrodes on a lower substrate;
a bank dividing the plurality of anode electrodes and covering an edge of each of the plurality of anode electrodes;
an organic light emitting layer on the plurality of anode electrodes;
a second electrode on the organic light emitting layer;
a scattering layer overlapping the bank, and
an encapsulation layer covering the second electrode,
wherein the scattering layer is disposed on or in the encapsulation layer, and
wherein a width of the scattering layer is wider than a width of the bank, and the scattering layer overlaps with only a partial region at a border of each of a plurality of emissive areas of the organic light emitting display device, and
wherein the encapsulation layer comprises at least one inorganic layer and at least one organic layer, and
wherein the scattering layer is disposed on the at least one inorganic layer or the at least one organic layer.
2. The organic light emitting display device of claim 1, further comprising a polarizer on an upper substrate facing the lower substrate.
3. An organic light emitting display device comprising:
a plurality of anode electrodes on a lower substrate;

a bank dividing the plurality of anode electrodes and covering an edge of each of the plurality of anode electrodes;
an organic light emitting layer on the plurality of anode electrodes;
a second electrode on the organic light emitting layer;
a scattering layer overlapping the bank;
an encapsulation layer covering the second electrode;
a plurality of color filters on the encapsulation layer; and
a black matrix between adjacent color filters, the black matrix overlapping the bank; and
an upper substrate on the plurality of color filters,
wherein a width of the scattering layer is wider than a width of the bank, and the scattering layer overlaps with only a partial region at a border of each of a plurality of emissive areas of the organic light emitting display device, and
wherein a width of the scattering layer is wider than a width of the black matrix, and
wherein the scattering layer is disposed between the upper substrate and the plurality of color filters.

4. A head-mounted display comprising:
an organic light emitting display device displaying an image;
a left-eye lens and a right-eye lens receiving the image displayed by the organic light emitting display device, wherein the organic light emitting display device comprises:
a plurality of anode electrodes on a lower substrate;
a bank dividing the plurality of anode electrodes and covering an edge of each of the plurality of anode electrodes;
an organic light emitting layer on the plurality of anode electrodes;
a second electrode on the organic light emitting layer;
a scattering layer overlapping the bank, and
an encapsulation layer covering the second electrode,
wherein the scattering layer is disposed on or in the encapsulation layer,
wherein a width of the scattering layer is wider than a width of the bank, and the scattering layer overlaps with only a partial region at a border of each of a plurality of emissive areas of the organic light emitting display device, and
wherein the encapsulation layer comprises at least one inorganic layer and at least one organic layer, and
wherein the scattering layer is disposed on the at least one inorganic layer or the at least one organic layer.

5. The head-mounted display of claim 4, further comprising a display accommodating case accommodating the organic light emitting display device.

6. The head-mounted display of claim 5, wherein the left-eye lens and the right-eye lens are disposed on one side of the display accommodating case.

7. The head-mounted display of claim 4, further comprising a half mirror between the organic light emitting display device and each of the left-eye lens and the right-eye lens.

8. The head-mounted display of claim 4, further comprising a polarizer disposed on an upper substrate facing the lower substrate.

9. The head-mounted display of claim 4, further comprising:
a plurality of color filters on the encapsulation layer; and
a black matrix between adjacent color filters, the black matrix overlapping the bank, wherein a width of the scattering layer is wider than a width of the black matrix.

* * * * *